(12) United States Patent
Charlet et al.

(10) Patent No.: US 8,153,503 B2
(45) Date of Patent: Apr. 10, 2012

(54) PROTECTION OF CAVITIES OPENING ONTO A FACE OF A MICROSTRUCTURED ELEMENT

(75) Inventors: Barbara Charlet, Montbonnot-Isere (FR); Hélène Le Poche, Grenoble (FR); Yveline Gobil, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 12/295,997

(22) PCT Filed: Apr. 3, 2007

(86) PCT No.: PCT/EP2007/053244
§ 371 (c)(1),
(2), (4) Date: Oct. 3, 2008

(87) PCT Pub. No.: WO2007/113300
PCT Pub. Date: Oct. 11, 2007

(65) Prior Publication Data
US 2009/0263920 A1    Oct. 22, 2009

(30) Foreign Application Priority Data
Apr. 5, 2006    (FR) ..................... 06 51210

(51) Int. Cl.
*H01L 21/322* (2006.01)
(52) U.S. Cl. ........ 438/455; 438/411; 438/622; 438/619; 438/638; 257/E21.002; 257/E21.579; 257/E21.581
(58) Field of Classification Search ........ 438/455; 445/24
See application file for complete search history.

(56) References Cited

U.S. PATENT DOCUMENTS

| | | | | |
|---|---|---|---|---|
| 5,038,070 A | * | 8/1991 | Bardai et al. | 313/309 |
| 5,127,990 A | * | 7/1992 | Pribat et al. | 216/17 |
| 5,164,632 A | * | 11/1992 | Yoshida et al. | 313/309 |
| 5,319,279 A | * | 6/1994 | Watanabe et al. | 313/309 |
| 5,332,627 A | * | 7/1994 | Watanabe et al. | 428/426 |
| 5,451,830 A | * | 9/1995 | Huang | 313/309 |
| 5,509,840 A | * | 4/1996 | Huang et al. | 445/24 |
| 5,559,389 A | * | 9/1996 | Spindt et al. | 313/310 |
| 5,564,959 A | * | 10/1996 | Spindt et al. | 445/24 |
| 5,628,661 A | * | 5/1997 | Kim et al. | 445/24 |
| 5,693,235 A | * | 12/1997 | Liu et al. | 216/11 |

(Continued)

FOREIGN PATENT DOCUMENTS
EP    0 483 814 A2    5/1992
(Continued)

OTHER PUBLICATIONS
International Search Report for PCT/EP2007/053244; May 15, 2007.

*Primary Examiner* — Fernando L Toledo
*Assistant Examiner* — Ankush Singal
(74) *Attorney, Agent, or Firm* — Pearne & Gordon LLP

(57) ABSTRACT

The invention relates to a method for protecting the interior of at least one cavity (4) having a portion of interest (5) and opening onto a face of a microstructured element (1), consisting of depositing, on said face, a nonconformal layer (6) of a protective material, in which said nonconformal layer closes off the cavity without covering the portion of interest.

The invention also relates to a method for producing a device comprising such a microstructured element.

8 Claims, 2 Drawing Sheets

U.S. PATENT DOCUMENTS

| | | | |
|---|---|---|---|
| 5,710,483 A * | 1/1998 | Peng | 313/497 |
| 5,783,905 A * | 7/1998 | Greschner et al. | 313/497 |
| 5,804,086 A * | 9/1998 | Bruel | 216/33 |
| 5,827,100 A * | 10/1998 | Kim | 445/24 |
| 5,882,532 A | 3/1999 | Field | |
| 6,010,383 A * | 1/2000 | Knall | 445/24 |
| 6,034,468 A * | 3/2000 | Wilshaw | 313/309 |
| 6,064,149 A * | 5/2000 | Raina | 313/497 |
| 6,066,542 A * | 5/2000 | Reznik et al. | 438/406 |
| 6,074,887 A * | 6/2000 | Lee et al. | 438/34 |
| 6,137,212 A * | 10/2000 | Liu et al. | 313/308 |
| 6,455,989 B1 * | 9/2002 | Nakada et al. | 313/309 |
| 6,528,930 B1 * | 3/2003 | Chang et al. | 313/310 |
| 6,579,140 B2 * | 6/2003 | Derraa | 445/24 |
| 6,616,497 B1 * | 9/2003 | Choi et al. | 445/24 |
| 6,632,114 B2 * | 10/2003 | Choi et al. | 445/24 |
| 6,753,544 B2 * | 6/2004 | Chen et al. | 257/10 |
| 6,831,398 B2 * | 12/2004 | Derraa | 313/309 |
| 6,875,626 B2 * | 4/2005 | Derraa | 438/20 |
| 6,875,686 B2 * | 4/2005 | Demolliens et al. | 438/622 |
| 7,138,329 B2 * | 11/2006 | Lur et al. | 438/619 |
| 7,365,482 B2 * | 4/2008 | Ryu et al. | 313/495 |
| 2001/0006321 A1 * | 7/2001 | Choi et al. | 313/309 |
| 2003/0153163 A1 * | 8/2003 | Letertre et al. | 438/458 |
| 2004/0232459 A1 * | 11/2004 | Takayama et al. | 257/295 |
| 2007/0138954 A1 * | 6/2007 | Takayama et al. | 313/506 |
| 2009/0280585 A1 * | 11/2009 | Koh et al. | 438/20 |

FOREIGN PATENT DOCUMENTS

| | | |
|---|---|---|
| EP | 1 529 753 A2 | 5/2005 |
| WO | 99/23682 A | 5/1999 |

* cited by examiner

PROTECTION OF CAVITIES OPENING ONTO A FACE OF A MICROSTRUCTURED ELEMENT

TECHNICAL FIELD

This invention relates to the production of devices comprising microstructures. It relates in particular to the field of microtechnology for microelectronics of microfluidics applications.

PRIOR ART

In the field of microtechnology, we commonly see elements of micrometric or even nanometric size arranged in cavities opening onto a face of a substrate. These elements can, for example, be microtips arranged in wells or in grooves of a field-emission cathode structure. Once the microtips have been formed in the cavities, there is the problem of subsequent treatments, for example to produce the connectors necessary for individual or group addressing of these microtips. Indeed, the microtips are elements vulnerable to certain technological steps. There is currently no suitable solution for protecting these vulnerable elements.

Document FR-A-2 715 502 (corresponding to U.S. Pat. No. 5,804,086) discloses a method for producing a structure comprising a substrate capable of supporting a superficial wafer made of a non-conductive material in order to produce integrated circuits, with internal cavities being arranged under the superficial wafer, in the substrate. The internal cavities thus produced are used to form channels for circulation of a coolant for the integrated circuits produced in the superficial wafer. Thus, the cavities formed superficially in the substrate are closed off by adding a thin layer. However, the cavities closed by the method disclosed in this document do not have a controlled atmosphere. Moreover, the fragility of the structure obtained does not make it possible to carry out steps of certain microelectronics methods and in particular heat and/or chemical treatments in order to produce complex structures.

In addition, from document FR-A-2 803 438 (corresponding to U.S. Pat. No. 6,875,686), we know a method for producing an interconnection structure including electrical insulation with air or vacuum cavities. These cavities are produced in a first layer of a material deposited on a substrate. A second layer of another material is deposited on the first layer, and the deposition of this second layer does not fill the cavities produced in the first layer. Therefore, this is a nonconformal deposition. This document describes the production of electrical insulation wafers.

DESCRIPTION OF THE INVENTION

The object of this invention is to provide effective protection of cavities opening onto a face of a microstructured element. This effective protection of cavities makes it possible to carry out one or more technological steps capable, in the absence of protection, of adversely affecting the cavities, either the cavities themselves or a device or element contained in the cavities.

The invention relates to a method for producing a device comprising at least one microstructured element consisting of a first substrate having a first face and a second face opposite the first face, in which at least one cavity has a portion of interest opening onto the first face, including:

the deposition on said first face of the first substrate of a nonconformal layer of protective material, in which said nonconformal layer closes off the cavity without covering the portion of interest;

characterised in that the method also includes:

the implementation of a technological method applied to the first substrate in order to produce said device, in which the technological method includes the attachment on the free face of the nonconformal layer of a second substrate and includes at least one delicate step for the portion of interest;

the at least partial removal of the nonconformal layer to expose the portion of interest.

By microstructured element, we mean any element having portions of micrometric or nanometric size, for example in the fields of microelectronics or microfluidics.

By portion of interest, we mean any element included in a cavity and vulnerable to at least one technological step, called a delicate step. This element included can be an active element, for example a nanodevice such as a field-effect electron emitter (nanotubes, nanowires, microtips, growth seed, catalyst deposit). It can involve at least one wall of the cavity or the cavity itself (vulnerable layer such as certain polymers or metals easily oxidisable in an uncontrolled atmosphere).

By nonconformal layer, we mean a layer of a material that, when deposited on a non-uniform surface, does not systematically match any relief of this surface, but leaves portions of this surface (portions consisting of small cavities) uncovered by said layer.

The second substrate can have an active portion (circuits or devices). In this case, it can consist, with the first substrate, of a coherent assembly of a structure (3D integration). It can also have the function of a handle allowing integration operations to be continued on the external faces of the assembly obtained. As an example of integration operations, it is possible to cite the thinning of the first substrate and/or of the handle, the formation of layers on the external faces, the modification of the properties o the external faces, without interaction with the internal faces of the assembly.

The layer of protective material closing the cavity or cavities performs a mechanical and chemical sealing function. It provides protection of the portion of interest of each cavity. This closure prevents interaction of the interior of a cavity with a surrounding and/or aggressive atmosphere during various integration steps.

Advantageously, the attachment of the second substrate on the nonconformal layer is carried out by molecular bonding or using an adhesive substance.

The first substrate can be thinned from the second face.

The production method can also include at least one step of treating the first substrate so as to produce means constituting the device. These means constituting the device can be chosen from among electrical connection elements, fluidic connection elements, optical connection elements, electronic components, fluidic components, optical components and optoelectric components. They can include means for electrical or fluidic access to the portion of interest of the cavity.

The production method can also include a step of attaching a third substrate to the free face of the first substrate. This attachment can be carried out by molecular bonding or using an adhesive substance. The third substrate can comprise means constituting the device. These means constituting the device can be chosen from among electrical connection elements, optical connection elements, fluidic connection elements, electronic components, fluidic components, optical components and optoelectric components. They can include means for electrical or fluidic or optical access to the portion of interest of the cavity.

An additional step can be provided for removing the second substrate. A step of at least partially removing the nonconformal layer of protective material can also be provided.

Another object of the invention consists of a method for producing a field-emission cathode structure implementing the production method above, with the portion of interest of a cavity consisting of electron emitting means. The electron emitting means can include at least one microtip.

BRIEF DESCRIPTION OF THE DRAWINGS

The invention can be better understood and other advantages and special features will appear on reading the following description given by way of a non-limiting example, accompanied by the appended drawings, in which.

DETAILED DESCRIPTION OF A SPECIFIC EMBODIMENT

Figure 1:
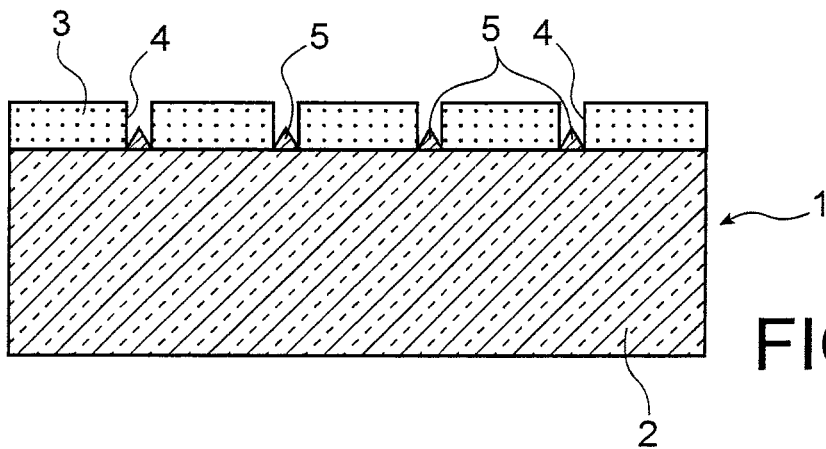
FIG. 1 shows, from a transverse cross-section view, a substrate of which a surface is provided with cavities containing microtips.

FIG. 1 shows, in a transverse cross-section view, a substrate of which a surface is provided with cavities containing microtips.

The substrate 1 consists of a plate 2, for example made of silicon or silicon-on-insulator (SOI), supporting a thin layer 3, for example made of silicon oxide. Cavities 4 have been formed in the thin layer 3, by an etching technique well known to a person skilled in the art. At the base of the cavities 4, microstructures have been formed, for example microsensors or, as shown in FIG. 1, microtips 5, by a formation technique well known to a person skilled in the art. Each cavity can have one or more microstructures.

Figure 2:
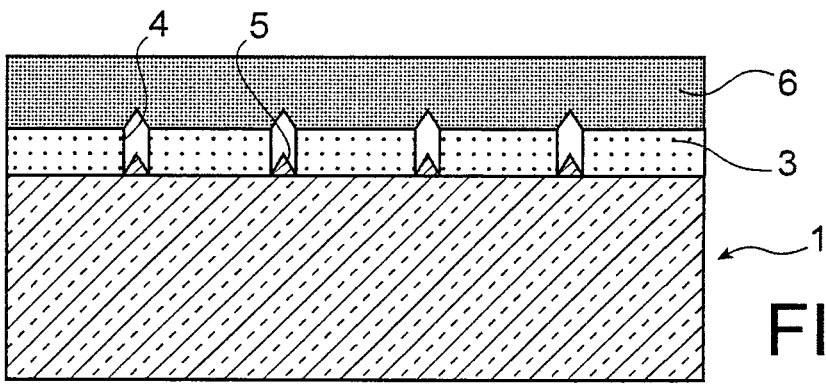
FIG. 2 shows, from a transverse cross-section view, the substrate of FIG. 1 of which the surface is coated with a nonconformal layer.

FIG. 2 shows the substrate 1 of FIG. 1 comprising, on the thin layer 3, a nonconformal layer 6. As an example, the nonconformal layer 6 can be a $SiO_2$ layer deposited by a PVD or PECVD method in a housing suitable for nonconformal deposition conditions (in terms of gas, pressure, polarisation of the substrate, temperature, etc.). As an example, it is possible to obtain a nonconformal deposition of $SiO_2$ by a PECVD method in the Applied P5000 housing under the following conditions: temperature 400° C., power 200 W, flow rate of $SiH_4$ 50 $cm^3$/min and flow rate of $N_2O$ 1800 $cm^3$/min. Alternatively, the nonconformal layer can be metal (for example aluminium, platinum or tungsten) can be deposited by a PVD method. For example, it is possible to obtain a nonconformal deposition of aluminium by a PVD deposition in an Applied Endura housing under the following conditions: temperature 450° C., power 1.2 kW and argon flow rate for atomising an AlCu target. In this example embodiment, the nonconformal layer 6 closes off the cavities 4, preserving the microtips 5. The closure of the cavities by the nonconformal layer makes it possible, by closing off the cavities under a controlled atmosphere, to carry out microelectronic steps capable of requiring heat and/or chemical treatments without damaging the microtips. Moreover, the use of this nonconformal deposition makes it possible to obtain a structure that is advantageously planar or capable of being planarised by standard techniques, which makes it possible to carry out subsequent steps, in particular lithography, chemical treatment, molecular bonding, and so on.

Figure 3:
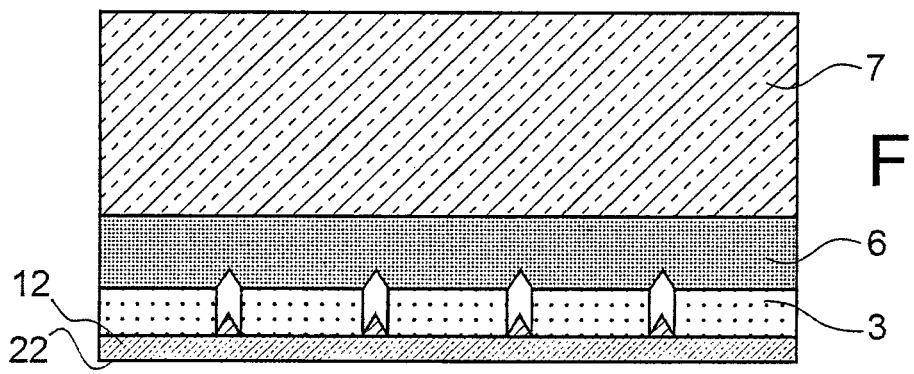
FIG. 3 shows, from a transverse cross-section view, the substrate of FIG. 2 of which a face has been thinned, and the other face is integrated with a handle.

A handle substrate 7, for example made of silicon, is then attached to the free face of the nonconformal layer 6, for example by molecular bonding or by an adhesive substance. This is shown in FIG. 3. In the case of molecular bonding, in particular when the openings of the cavities are greater than 1 µm, it is advantageous to first use a step of surface planarisation of the nonconformal layer. A nonconformal thin layer deposit (performed, for example by PECVD, PVD, etc.) is not naturally equipped with a smooth surface, in particular after coating cavities. Therefore, the free surface of a nonconformal material layer is not capable of being attached to another surface by molecular bonding. Indeed, for this type of bonding, the surface roughness must be much lower than 1 nm RMS. The typical surface roughness values for a nonconformal deposit produced on a topology-free surface are within a range of several hundred nm RMS for the nonconformal layers with a thickness greater than 1 µm and within a range of several dozen nm RMS for thinner nonconformal layers. These values may vary according to the nature of the deposit and according to the topology of the surface on which it is deposited. To carry out a direct bonding of a nonconformal layer, it is therefore essential to smooth this layer in order to make it capable of being bonded with a surface that has the characteristics required for effective molecular bonding.

The micrometric and nanometric cavities can be covered by the deposition of a nonconformal layer. For example, for a nonconformal PECVD deposit, the diameters of maximal opening of coverable cavities are around 2 µm. In the case of total coverage (closure of cavity by PECVD deposit), the total thickness of the deposited layer is greater than half of the largest dimension of the surface opening of said cavity. The thickness of the deposit is independent of the shape factor of the cavities to be covered. The presence of cavities contributes to an increase in the roughness of the surface of the nonconformal layer. It is then difficult to obtain the surface roughness conditions required for molecular bonding without appropriate preparation.

A smooth or low-roughness surface can be obtained by a mechanical-chemical polishing method, by mechanical, thermal, thermo-optical (laser), thermoionic (plasma) or chemical surface finishing. A surface thus planarised can then be conditioned for direct bonding (also called molecular bonding) by methods ensuring the affinities required between the surfaces to be placed in contact, for example, bonds between two hydrophilic surfaces established by intermolecular forces. The planarisation and conditioning treatments before bonding of such surfaces can be performed by standard methods, without disturbing the devices or portions of interest contained in the cavities.

The substrate 1 is then thinned so that of the plate 2, only a thinned portion 12 remains, with a free face 22. The thinning can be performed by a mechanical-chemical polishing method or by the Smartcut method® disclosed in the document FR-A-2 681 472 (corresponding to the American patent U.S. Pat. No. 5,374,564). The thinned portion 12 can be used to form connector elements, transistors, optical elements, and so on.

Figure 4:
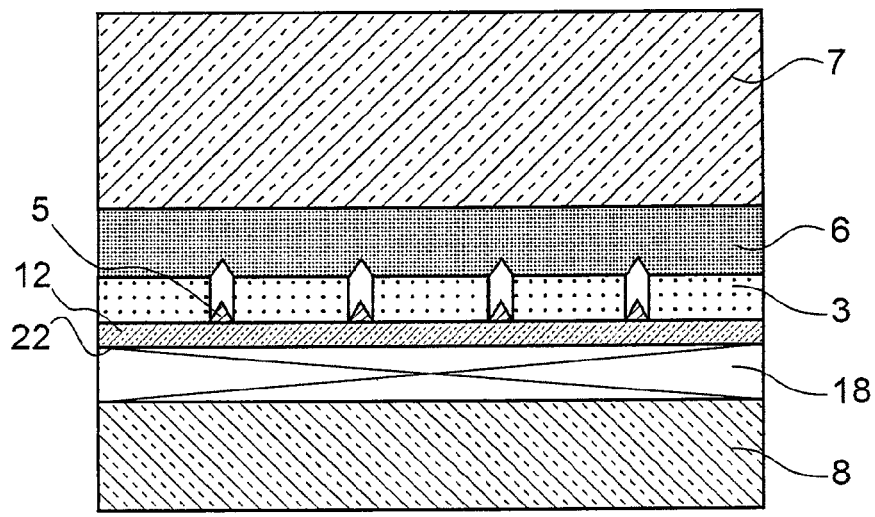
FIG. 4 shows, from a transverse cross-section view, integration of the substrate of FIG. 3 with a microelectronic circuit.

The thinned portion 12 can also receive a substrate 8 attached to the face 22, for example by molecular bonding or by an adhesive substance. This is shown in FIG. 4. This substrate 8 can advantageously comprise en electronic circuit 18 (for example an MOS circuit) intended to operate in relation with the microtips 5.

Figure 5:
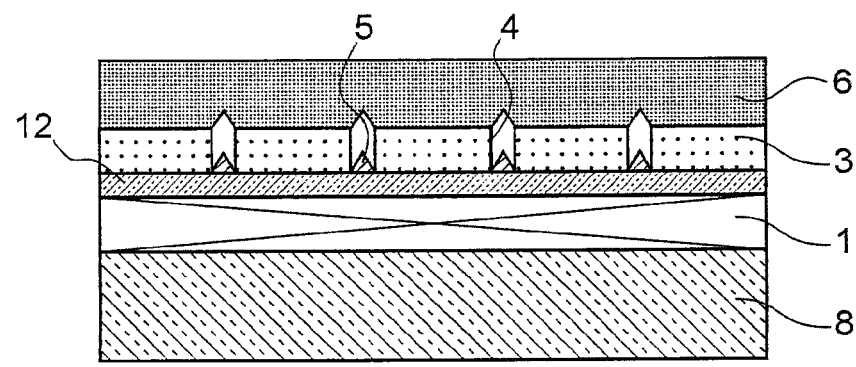
FIG. 5 shows, from a transverse cross-section view, the substrate of FIG. 4 from which the handle has been removed.

The handle substrate can then be thinned or removed, for example by mechanical-chemical polishing, or by detachment. The structure shown in FIG. 5 is obtained. At this stage of integration, it is possible to carry out the technological steps between the MOS circuit and the devices contained in the cavities since the cavities remain protected by the nonconformal deposit, which seals them. A partial or total removal of the nonconformal layer 6 is possible in the appropriate step for the final structure.

Figure 6:
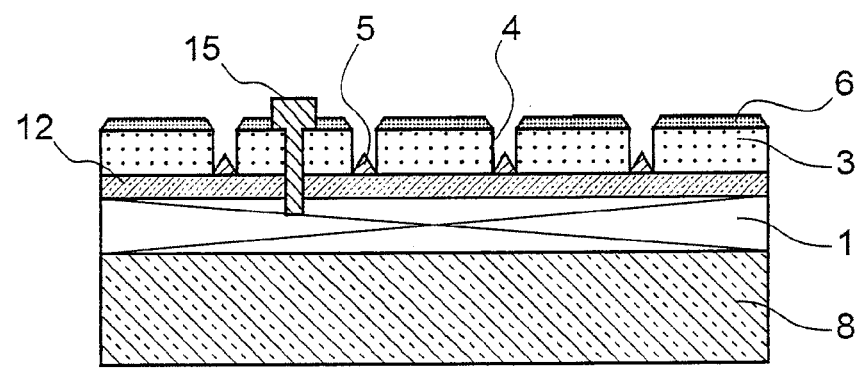
FIG. 6 shows, from a transverse cross-section view, the substrate of FIG. 5 in which the cavities are reopened and an interconnection has been produced.

It is then possible, as shown in FIG. 6, to carry out an optional mechanical thinning step of the nonconformal layer 6, then to locally form openings in the layer 6 in order to produce interconnections 15, for example, between the free face of the thin layer 3 and the electronic circuit 18. The cavities can then be reopened, for example by chemical etching of the nonconformal layer 6.

As an example, the description relates to a substrate of which a surface is provided with cavities containing microtips. The invention of course applies to other portions of interest, for example nanotubes (carbon nanotubes, inter alia), in particular for the field-emission cathode application.

The invention claimed is:

1. Method for producing a device comprising at least one microstructured element, comprising the following steps in the order set forth:
providing a first substrate having a first face and a second face opposite the first face, at least one cavity including a portion of interest being opened in the first face;
after said providing, depositing on said first face of the first substrate a nonconformal layer of protective material to close off the at least one cavity without filling the portion of interest;
after said depositing, attaching on the nonconformal layer a second substrate by molecular bonding or using an adhesive substrate;
after said attaching, thinning the first substrate from the second face of the first substrate and producing from the second face of the first substrate at least one electrical connection to the portion of interest of the cavity; and
after said thinning, removing at least partially the nonconformal layer and exposing the portion of interest.

2. Production method according to claim 1, wherein it also includes, after said step of thinning and before said step of removing, a step of attaching a third substrate to the free face of the first substrate.

3. Production method according to claim 1, wherein it also includes a step of total or partial removal of the second substrate.

4. Production method according to claim 3, wherein it also includes a step of at least partial removal of the nonconformal layer of protective material.

5. Production method according to claim 2, wherein the attachment of the third substrate to the first substrate is carried out by molecular bonding or using an adhesive substance.

6. Production method according to claim 2, wherein, the third substrate comprises means constituting the device, said means constituting the device being chosen from among electrical connection elements, optical connection elements, fluidic connection elements, electronic components, fluidic components, optical components and optoelectric components.

7. Method for producing a field-emission cathode structure implementing the method according to any one of claims 1, 2, 5, 6, 3 and 4, wherein the portion of interest of a cavity consists of electron emitting means.

8. Method according to claim 7, wherein the electron emitting means include at least one microtip.

* * * * *